United States Patent [19]
Yamagata

[11] Patent Number: 5,210,053
[45] Date of Patent: May 11, 1993

[54] METHOD FOR FABRICATING SEMICONDUCTOR DEVICE

[75] Inventor: Yasushi Yamagata, Tokyo, Japan

[73] Assignee: NEC Corporation, Tokyo, Japan

[21] Appl. No.: 846,083

[22] Filed: Mar. 5, 1992

[30] Foreign Application Priority Data

Mar. 6, 1991 [JP] Japan .................................. 3-039654

[51] Int. Cl.$^5$ ......................................... H01L 21/441
[52] U.S. Cl. .................................. 437/192; 437/193; 437/194; 437/195
[58] Field of Search ............... 437/192, 193, 194, 195; 148/DIG. 25, DIG. 26

[56] References Cited

U.S. PATENT DOCUMENTS

| | | | |
|---|---|---|---|
| 3,769,108 | 10/1973 | Feldman et al. | 437/192 X |
| 4,265,935 | 5/1981 | Hall | 437/192 |
| 5,063,175 | 11/1991 | Broadbent | 437/192 |

Primary Examiner—John S. Maples
Attorney, Agent, or Firm—Burns, Doane, Swecker & Mathis

[57] ABSTRACT

A method for fabricating a semiconductor device includes steps of forming wirings on the surface of a semiconductor substrate with a plurality of diffused layers; forming a first insulating film whose surface is flattened; forming a first group of contact holes having substantially the same depth reaching the diffused layers and the wirings; embedding selectively grown conductive layers in the first group of contact holes; depositing a second insulating film on the entire surface; forming, in the first insulating film and the second insulating film, a second group of contact holes having substantially the same depth reaching the other of the diffused layers and the wirings; and embedding selectively grown conductive layers in the second group of contact holes. A plurality of contact holes with different depths formed in an interlayer insulating film are grouped into two or more groups in accordance with their depth, and are filled with contact materials selectively grown by individual processes so that the surface of the contacts thus formed can be made completely flat. Thus, regardless of the thickness of the interlayer insulating film formed on a chip, stabilized wirings can be made with good coverage for the contacts so that the reliability of the completed semiconductor device can be greatly enhanced.

8 Claims, 8 Drawing Sheets

METHOD FOR FABRICATING SEMICONDUCTOR DEVICE

BACKGROUND OF THE INVENTION (1) Field of the Invention

The present invention relates to a method for fabricating a semiconductor device, and more particularly to a method for forming wirings in a semiconductor device.

(2) Description of the Related Art

With a development of high-integration of MOS ICs; the size of a contact hole and the width of a wiring have been reduced. Therefore, reliability of the wirings, e.g., to ensure that there is no disconnection of an aluminum wiring at different contact levels, is becoming increasingly important.

Now, referring to FIGS. 1A through 1C, an explanation will be given on the method of fabricating wirings according to the prior art.

First, as shown in FIG. 1A, an interlayer insulating film 17 is formed on a semiconductor substrate 1 with a diffused layer 5 being formed therein, and thereafter a contact hole 9 is opened in the interlayer insulating film 17 by a photolithography technique.

Next, as shown in FIG. 1B, an aluminum layer 12 is deposited on the entire surface involving the area of the contact hole 9 of the interlayer insulating film 17 by sputtering.

Finally, as shown in FIG. 1C, the aluminum layer 12 is patterned to provide an aluminum wiring, thus completing a device area.

The technique described above has the following defect. If the integration degree of a MOS IC is increased so that the size of the contact hole is reduced to provide a large aspect ratio, the aluminum wiring tends to be easily broken or disconnected.

In order to obviate such a defect, a technique of embedding a minute contact through selective growth of tungsten (W) has been proposed. This technique will be explained below with reference to FIGS. 2A and 2B.

First, as shown in FIG. 2A, by anisotropic etching, a contact hole 9 is opened within an interlayer insulating film 17 on the diffused layer 5 formed in a semiconductor substrate 1, and thereafter tungsten (W) 10 is embedded in the contact hole 9 by selective growth.

Next, as shown in FIG. 2B, aluminum (A1) is deposited on the interlayer insulating film 17 by sputtering, and the aluminum layer thus formed is patterned to provide an aluminum wiring 12.

This technique makes flat the upper surface of the contact so that the aluminum wiring is prevented from being broken at a level difference portion of the contact.

However, this technique has also the following problem to be solved. Namely, with the method of forming a wiring using this technique, it is not possible to embed contacts in contact holes with different depths simultaneously and satisfactorily. The reason for this will be described below.

Now, it is assumed that, as shown in FIG. 3A, a field insulating film 2, a gate insulating film 3 and a diffused layer 5 are formed on a semiconductor substrate 1. A polysilicon (also called polycrystalline silicon) layer 4 is formed on the field insulating film 2, and the polysilicon layer 4 is covered with an interlayer insulating film 17 with its surface being made flat. Further, contact holes 9 with different depths reaching the polysilicon layer 4 and the diffused layer 5, respectively, are opened in the interlayer insulating film 17.

Here, if tungsten (W) 10 is selectively grown, it will be sufficiently embedded into the contact hole on the polysilicon layer 4, whereas it will not be embedded even half-way into the contact hole on the diffused layer 5.

Further, if an aluminum wiring 12 is formed, as shown in FIG. 3B, it will stop above the tungsten 10 on the diffused layer 5.

In order to prevent the aluminum wiring from being broken, the contact holes must be formed partially by isotropic etching. However, if the isotropic etching is restrained so that the contact hole is not enlarged at the shallow portion of the contact step, a high vertical step will be left at the deep portion of the contact step. Tungsten cannot then be sufficiently embedded into the contact hole with the high vertical step. This leads to poor coverage of the aluminum wiring. For example, assuming that the thickness of the interlayer insulating film on the polysilicon 4 is 0.6 $\mu$m and that on the diffused layer 5 is 1.6 $\mu$m, if the isotropic etching is restrained so that the contact hole is not enlarged at the shallow portion of the contact step, the contact hole thus formed is about 0.6 $\mu$m in depth, so that a vertical step of about 1.0 $\mu$m in thickness will be left on the diffused layer 5. Although 0.6 $\mu$m of 1.0 $\mu$m can be embedded with tungsten (W), a vertical step of about 0.4 $\mu$m in depth will be still left. If the size (diameter) of the contact hole 9 is 0.6–0.8 $\mu$m, the aspect ratio thereof is approximately equal to one (1). If the aluminum wiring of 0.5 $\mu$m in thickness is formed on the contacts thus formed, it is estimated that this results in a 10% or less step coverage.

As understood from the above description about the prior art, it is difficult to make the aluminum wiring with a satisfactory step coverage on the contacts with different depths by the method for making an aluminum wiring according to the prior art.

SUMMARY OF THE INVENTION

It is, therefore, an object of the invention to overcome the problems existing in the conventional methods and to provide an improved method for fabricating a semiconductor device having wirings with a satisfactory step coverage on contacts.

In order to attain the above object, in accordance with the present invention, there is provided a method for fabricating a semiconductor device, comprising steps of:

forming first wirings on a main surface of a semiconductor substrate with a plurality of diffused layers;

forming a first insulating film having a flat surface over its entirety;

forming, in the first insulating film, a first group of contact holes having substantially the same depth reaching one of the diffused layers and the wirings;

embedding first selectively grown conductive layers in the first group of contact holes;

depositing a second insulating film on the entire surface;

forming, in the first insulating film and the second insulating film, a second group of contact holes having substantially the same depth reaching the other of the diffused layers and the wirings; and embedding second selectively grown conductive layers in the second group of contact holes.

In accordance with the present invention, wirings with good coverage can be made on the contacts of the semiconductor device.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be explained with reference to the accompanying drawings.

Referring to FIGS. 4A through 4C, FIGS. 5A through 5C and FIGS. 6A through 6C, a first embodiment of the present invention will be explained below. As an example, it is now assumed that contacts with different depths on diffused layers and a field insulating layer are formed on the same semiconductor chip.

Figure 1A:
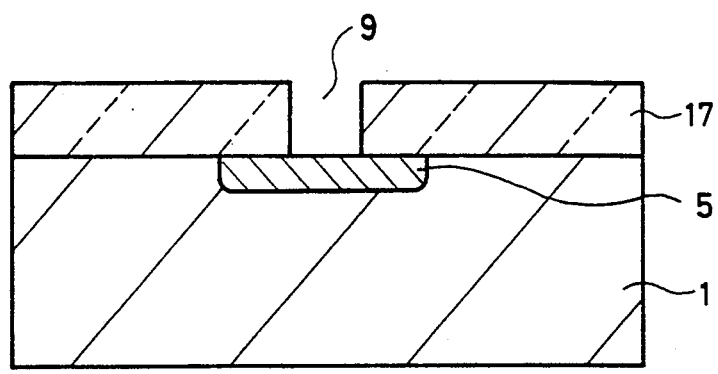
FIGS. 1A through 1C are sectional views for explaining steps of prior art techniques for making a wiring.
Figure 1B:
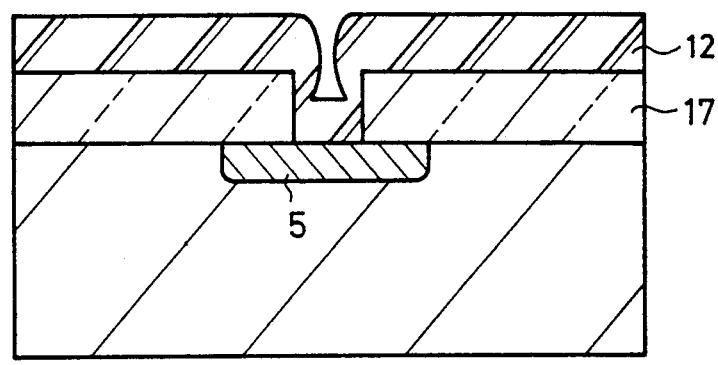
Figure 1C:
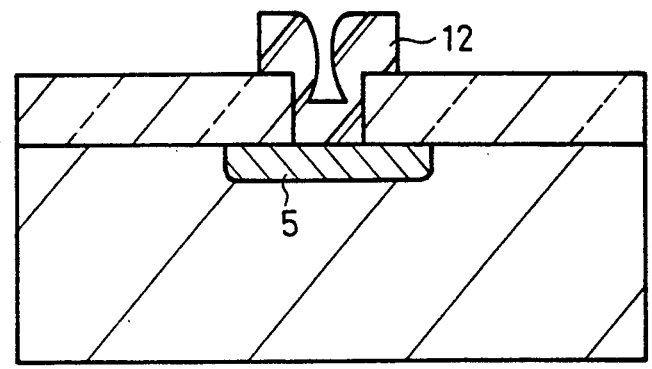
Figure 2A:
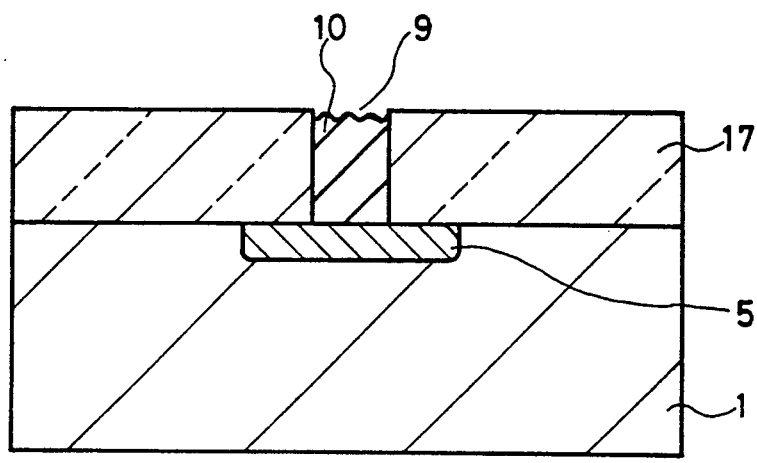
FIGS. 2A and 2B are sectional views for explaining steps of another prior art techniques for making a wiring.
Figure 2B:
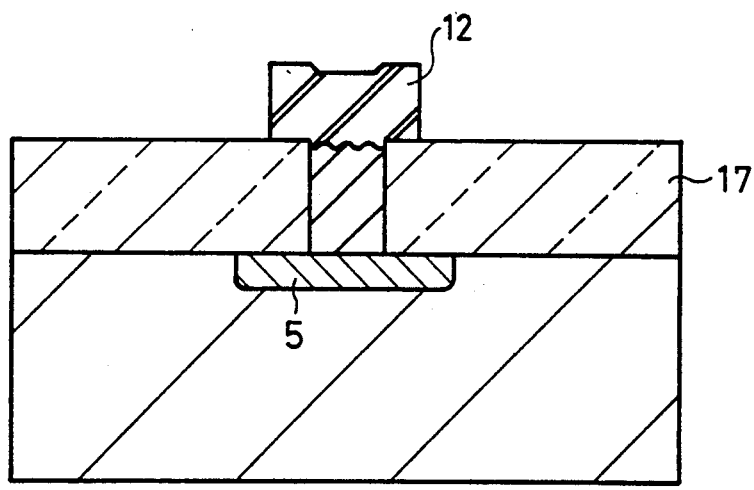
Figure 3A:
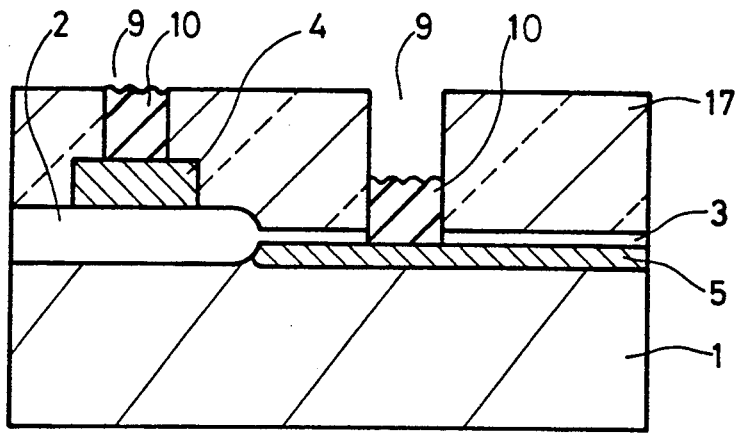
FIGS. 3A through 3C are sectional views for explaining the problems inherent in the prior art techniques.
Figure 3B:
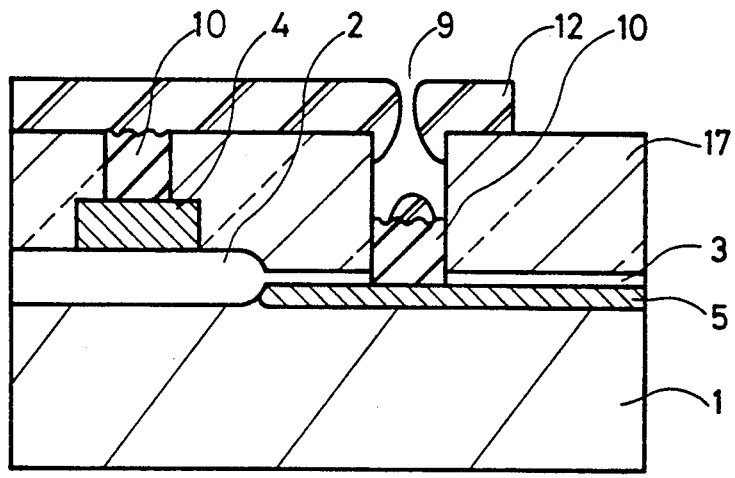
Figure 3C:
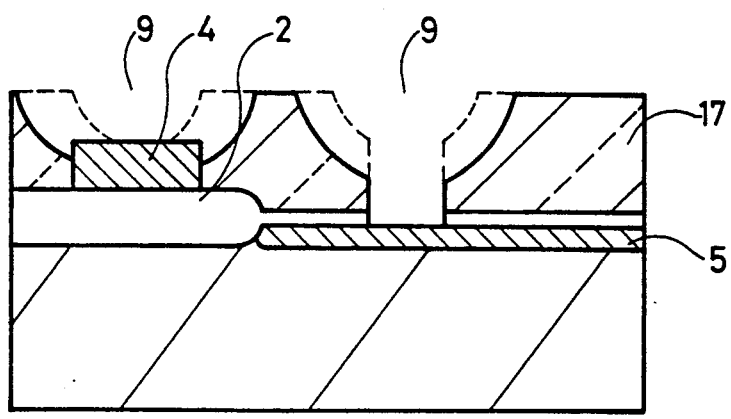
Figure 4A:
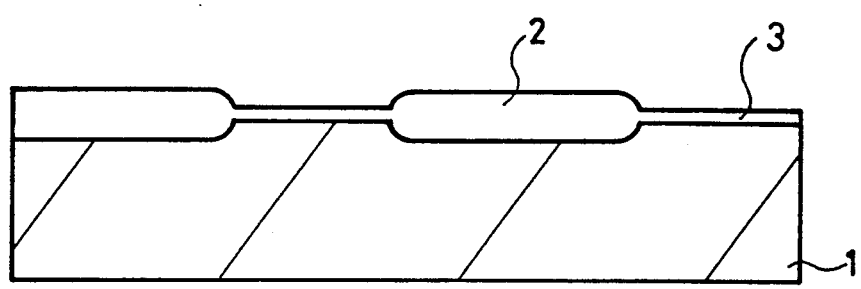
FIGS. 4A through 4C, FIGS. 5A through 5C, and FIGS. 6A through 6C are sectional views for explaining successive steps, respectively, in a first embodiment according to the present invention.

First, as shown in FIG. 4A, by method of local oxidation of silicon (LOCOS), field insulating films 2 having a thickness of 0.6 μm and gate insulating films 3 are formed on a semiconductor substrate 1.

Figure 4B:
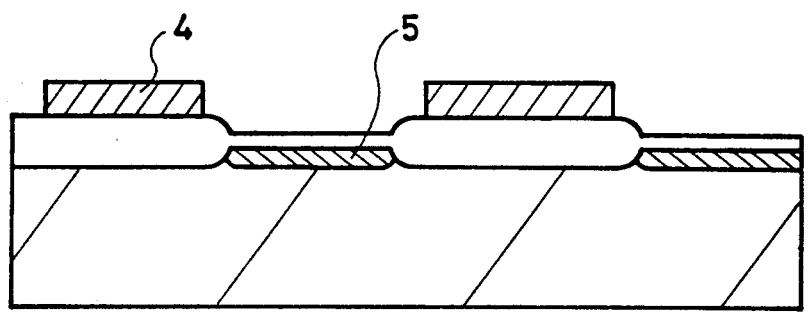

Next, as shown in FIG. 4B, polysilicon layers 4 having a thickness of 4000 Å are formed on the field insulating films 2 by way of chemical vapor deposition (CVD) and photolithography techniques, and thereafter, impurities having the conduction type opposite to that of the semiconductor substrate 1 are ion-implanted into the semiconductor substrate 1 through the gate insulating films 3 between the field insulating films 2, so that diffused layers 5 are formed in the semiconductor substrate 1.

Figure 4C:
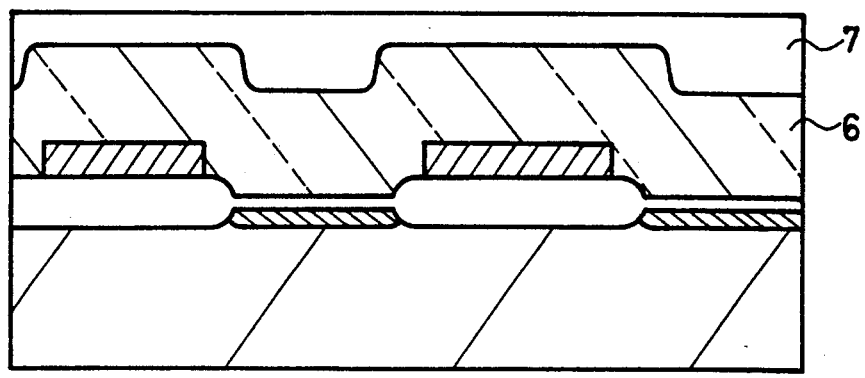

As shown in FIG. 4C, a boron phosphosilicate glass (abbreviated "BPSG") film 6 having a thickness of, e.g., 2.0 μm serving as an interlayer insulating film is deposited over the entire resultant surface, and photoresist 7 is applied thereon.

Figure 5A:
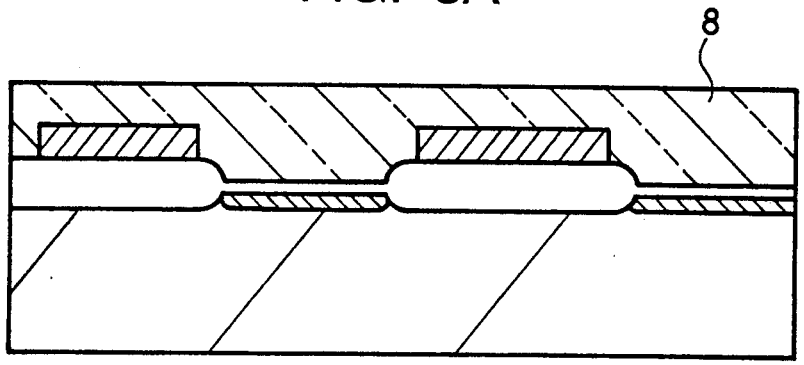

As shown in FIG. 5A, a first interlayer insulating film 8 with its surface made flat is formed by dry-etching with substantially the same selection rate for the phtoresist 7 and the BPSG film 6. It should be noted that in order to make the surface of the first interlayer insulating film 8 flat, a tetraethylorthosilicate (abbreviated "TEOS") film or a spin-on-glass (abbreviated "SOG") film may be used instead of the BPSG film 6.

Figure 5B:
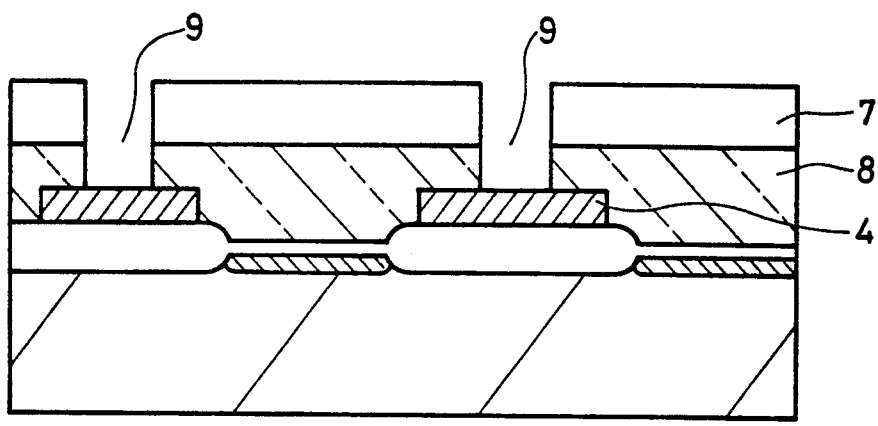

Next, as shown in FIG. 5B, by using photoresist 7 as a mask, the first interlayer insulating film 8 is subjected to anisotropic etching to form a first group of contact holes 9 which reach the polysilicon layers 4, respectively.

Figure 5C:
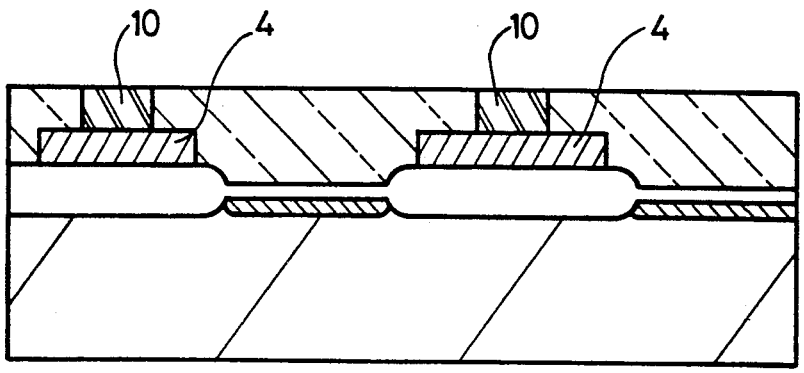

After the photoresist 7 has been removed, as shown in FIG. 5C, tungsten (W) 10 is selectively grown on the polysilicon 4, so that it is embedded into the first group of contact holes 9. In this case, since the depth of each of the first group of contact holes 9 is approximately uniform, tungsten 10 can be satisfactorily embedded in all the contact holes 9.

Figure 6A:
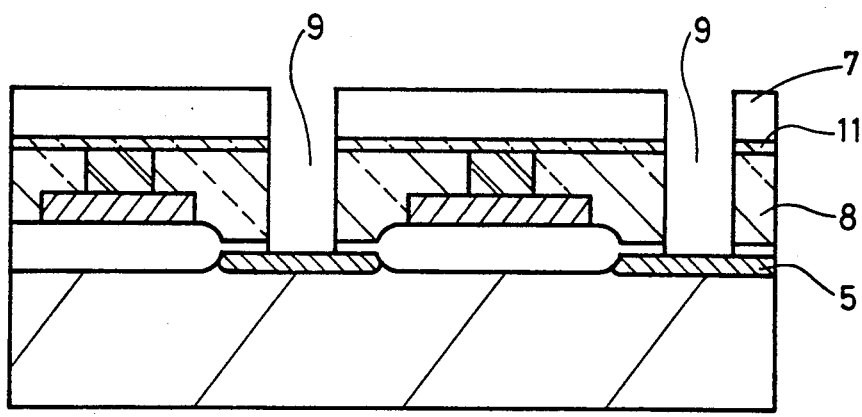

Next, as shown in FIG. 6A, second interlayer insulating film 11 which is made of a relatively thin oxide film having a thickness of, e.g., 1000 Å, is deposited on the resultant entire surface by way of plasma-assisted chemical vapor deposition (PCVD) techniques. Further, by using photoresist 7 as a mask, the second interlayer insulating film 11 and the first interlayer film 8 are selectively etched by the anisotropic etching to form a second group of contact holes reaching the diffused layers 5.

Figure 6B:
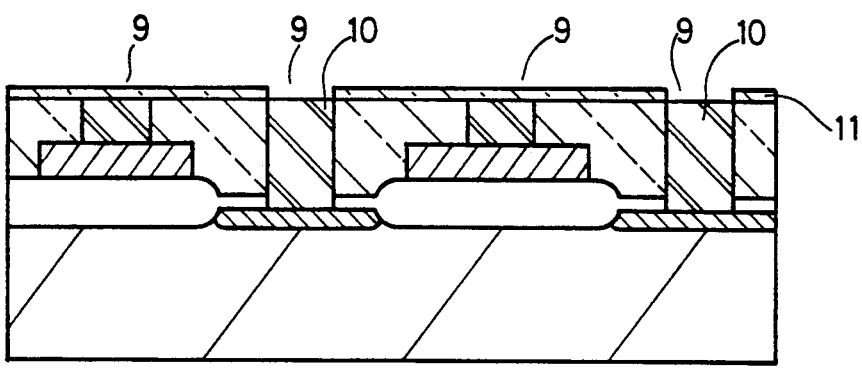

After the photoresist 7 has been removed, as shown in FIG. 6B, tungsten (W) 10 is selectively grown on the diffused layers 5, so that it is embedded into the second group of contact holes 9. In this case also, since the depth of each of the second group of contact holes 9 is approximately uniform, tungsten (W) 10 is satisfactorily embedded into all the second group of contact holes 9.

Figure 6C:
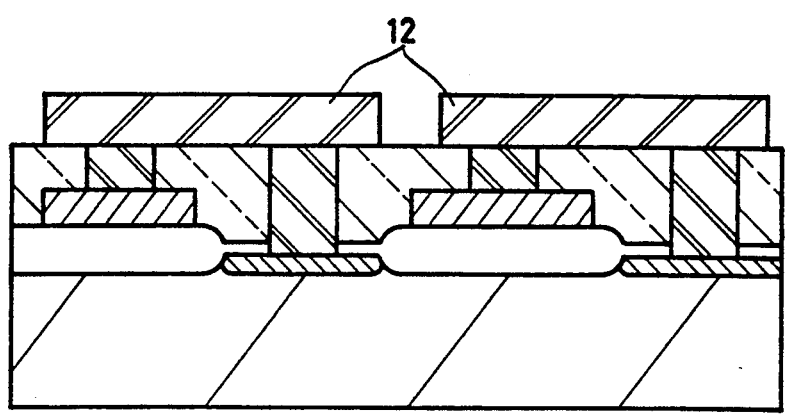

Finally, as shown in FIG. 6C, the second interlayer insulating film 11 is removed by the wet-etching using buffered hydrofluoric acid (HF), and aluminum (Al) wirings 12 are formed so as to cover the tungsten contacts 10.

It is not necessarily required that the contact holes 9 are completely filled with tungsten selectively grown, and such a level difference which presents no hindrance in the step coverage of the aluminum wiring for the contacts can remain. For example, after the contact holes with the diameter of 1.0 μm are filled with tungsten (W), the presence of a level difference of 0.3 μm or less causes no problem. As a material to be embedded, a refractory metal, e.g., molybdenum (Mo) which can be selectively grown may be used in place of tungsten (W). Further, the contacts on the diffused layers 5 may be formed earlier instead of those on the polysilicon layers 4 being formed earlier.

Next, referring to FIGS. 7A through 7C and also FIGS. 8A through 8C, an explanation will be given on the second embodiment of the present invention. As an example, it is now assumed that overlying aluminum wirings are formed on contacts with different depths on diffused layers and on underlying aluminum wirings.

Figure 7A:
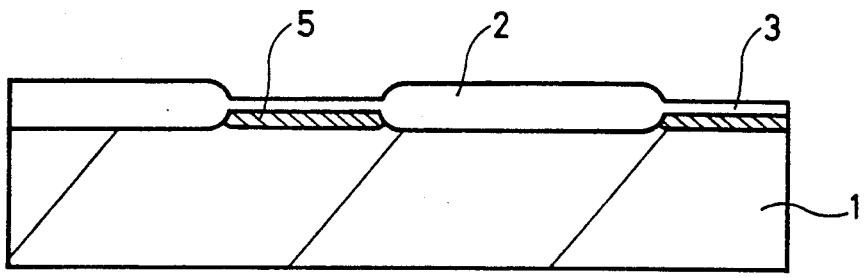
FIGS. 7A through 7C and FIGS. 8A through 8C are sectional views for explaining successive steps, respectively, in a second embodiment according to the present invention.

First, as shown in FIG. 7A, by way of "LOCOS" method, field insulating films 2 having a thickness of 0.6 μm and gate insulating films 3 are formed on a semiconductor substrate 1. Subsequently, impurities having the conduction type opposite to that of the semiconductor substrate 1 are ion-implanted into the semiconductor substrate 1 through the gate insulating films 3 between the field insulating films 2, so that diffused layers 5 are formed in the semiconductor substrate 1.

Figure 7B:
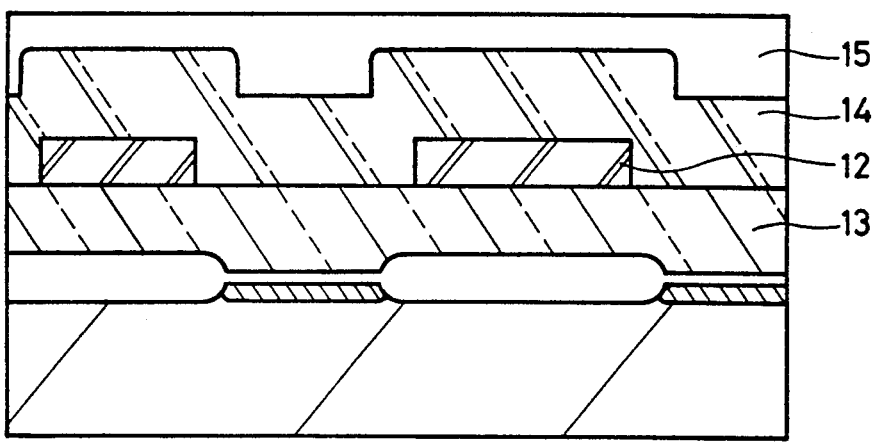

As shown in FIG. 7B, an interlayer insulating film 13 with its entire surface made flat in the same manner as in the first embodiment is formed, and thereafter aluminum wirings 12 serving as underlying wiring are formed on the flattened interlayer insulating film 13. Further, a silicon oxide ($SiO_2$) film 14 having a thickness of 1.5 μm is grown on the resultant surface by plasma-assisted chemical vapor deposition methods, and a silica film 15 is applied on the film 14 by a spin coating method. A photoresist film may be adopted instead of the silica film 15.

Figure 7C:
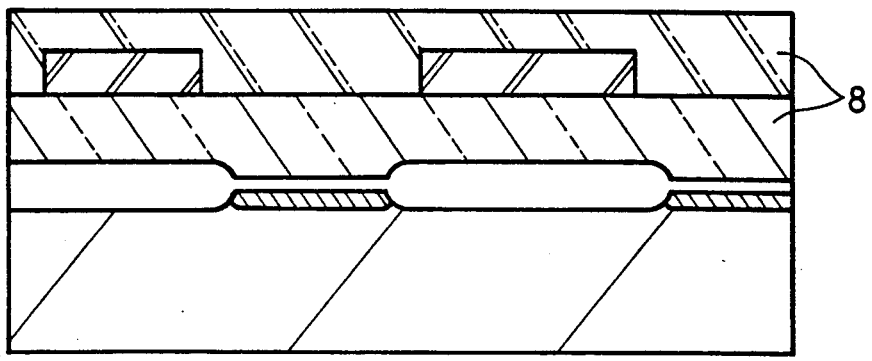

As shown in FIG. 7C, the dry-etching with substantially the same selection ratio for the silica film 15 and the silicon oxide (SiO$_2$) film 14 is carried out to a first two-layer insulating film 8 with its surface made flat.

Additionally, the insulating film 8 formed on the aluminum wirings 12 by the above process may be formed by the process in which after a silicon oxide (SiO$_2$) film having a thickness of 0.6 μm has been grown by the plasma-assisted chemical vapor deposition, a silica film is applied thereon to provide a flat surface, and another silicon oxide (SiO$_2$) film having a thickness of 0.3 μm is grown on the silica film.

Figure 8A:
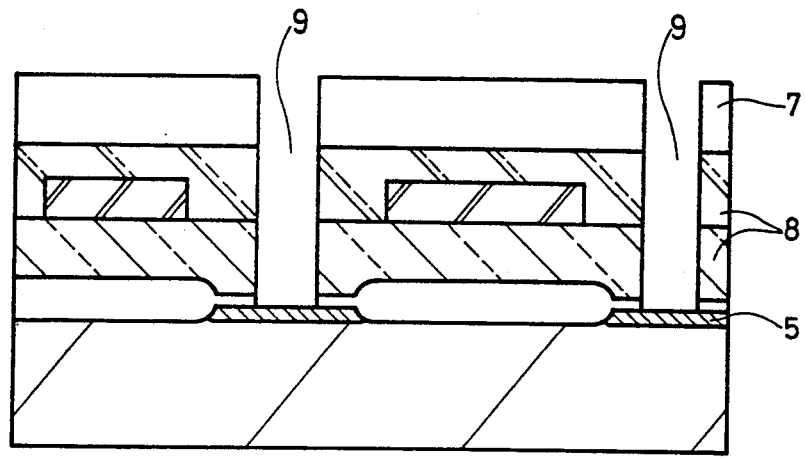

As shown in FIG. 8A, by using a photoresist 7 as a mask, the first flat insulating film 8 is subjected to anisotropic etching, so that the first group of contact holes 9 reaching the diffused layers 5 are formed.

Figure 8B:
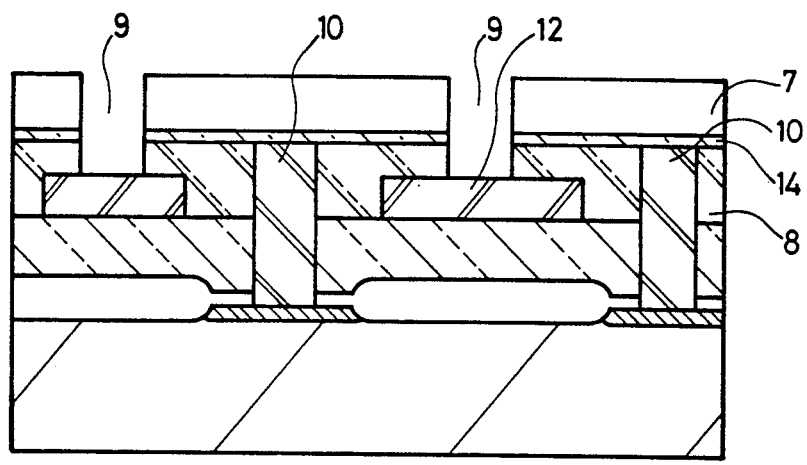

As shown in FIG. 8B, after the photoresist has been removed, tungsten (W) 10 is selectively grown so as to be embedded into the contact holes 9 on the diffused layers 5. Subsequently, a silicon oxide (SiO$_2$) film 14 having a thickness of 0.1 μm is grown by the plasma vapor growth so as to cover the surface of the embedded tungsten contacts 10. Further, by using the photoresist 7 as a mask, anisotropic etching is carried out for the silicon oxide film 14 and the first insulting film 8 so as to form a second group of contact holes 9 reaching the surfaces of the aluminum wirings 12.

Figure 8C:
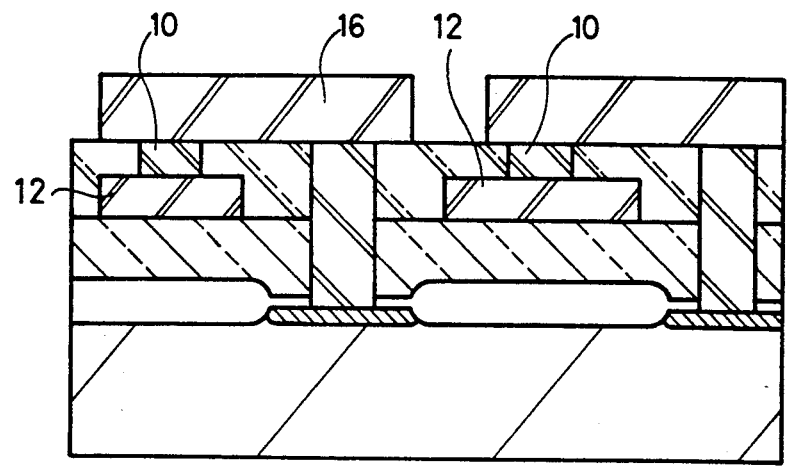

Finally, as shown in FIG. 8C, tungsten (W) 10 is selectively grown so as to be embedded into the second group of contact holes 9 on the exposed surface of the aluminum wirings 12. The SiO$_2$ film 14 is removed so that the surface of the tungsten contacts 10 in all the contact holes 9 is exposed, and thereafter, second aluminum wirings 16 are formed on the exposed surface.

In both the first and second embodiments, in order to embed a contact material in contact holes with different depths, these contact holes were grouped into two groups, but it is needless to say that they may be grouped into three or more groups. For example, they may be in three groups for three kinds of contacts connecting the aluminum wiring with the diffused layers, the first aluminum wiring with the polysilicon layers and the second aluminum wiring with the diffused layers.

In accordance with the present invention, a plurality of contact holes with different depths formed in an interlayer insulating film are grouped in accordance with their depth, and are filled with contact materials selectively grown by individual processes, so that the surface of the contacts thus formed is made completely flat. Thus, regardless of the thickness of the interlayer insulating film formed on a chip, stabilized wirings can be made with good coverage for the contacts so that the reliability of the completed semiconductor device can be greatly enhanced.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device, comprising the steps of:
   forming first wirings over a main surface of a semiconductor substrate with a plurality of diffused layers;
   forming a first insulating film having a flat surface over its entirety;
   forming, in said first insulating film, a first group of contact holes having substantially the same depth reaching one of said diffused layers and said first wirings;
   embedding a first selectively grown conductive layer in said first group of contact holes;
   depositing a second insulating film on the entire surface;
   forming, in said first insulating film and said second insulating film, a second group of contact holes having substantially the same depth reaching the other of said diffused layers and said first wirings; and
   embedding a second selectively grown conductive layer in said second group of contact holes.

2. A method for fabricating a semiconductor device according to claim 1, wherein said first group of contact holes and said second group of contact holes have different depths from each other.

3. A method for fabricating a semiconductor device according to claim 1, wherein said first wirings are formed of a polysilicon layer.

4. A method for fabricating a semiconductor device according to claim 1, wherein said first wirings are formed of an aluminum conductive layer.

5. A method for fabricating a semiconductor device according to claim 1, further comprising a step of forming a second wiring on said first and second selectively grown conductive layers.

6. A method for fabricating a semiconductor device according to claim 1, wherein said first and second selectively grown conductive layers are formed of a refractory metal.

7. A method of fabricating a semiconductor device according to claim 6, wherein said refractory metal is tungsten (W).

8. A method of fabricating a semiconductor device according to claim 6, wherein said refractory metal is molybdenum (Mo).

* * * * *